(12) United States Patent
Nakamura et al.

(10) Patent No.: US 12,156,474 B2
(45) Date of Patent: Nov. 26, 2024

(54) PIEZOELECTRIC DEVICE AND METHOD OF MANUFACTURING THE SAME

(71) Applicant: Nitto Denko Corporation, Ibaraki (JP)

(72) Inventors: Daisuke Nakamura, Ibaraki (JP); Naoki Nagaoka, Ibaraki (JP); Manami Kurose, Ibaraki (JP); Hironobu Machinaga, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 819 days.

(21) Appl. No.: 17/279,692

(22) PCT Filed: Sep. 20, 2019

(86) PCT No.: PCT/JP2019/037070
§ 371 (c)(1),
(2) Date: Mar. 25, 2021

(87) PCT Pub. No.: WO2020/066930
PCT Pub. Date: Apr. 2, 2020

(65) Prior Publication Data
US 2022/0037580 A1 Feb. 3, 2022

(30) Foreign Application Priority Data

Sep. 28, 2018 (JP) .................................. 2018-185550
Mar. 27, 2019 (JP) .................................. 2019-061630

(51) Int. Cl.
*H01L 41/083* (2006.01)
*H10N 30/00* (2023.01)
(Continued)

(52) U.S. Cl.
CPC ......... *H10N 30/508* (2023.02); *H10N 30/057* (2023.02); *H10N 30/076* (2023.02);
(Continued)

(58) Field of Classification Search
CPC .......... H10N 30/508; H10N 30/10516; H10N 30/853
See application file for complete search history.

(56) References Cited

U.S. PATENT DOCUMENTS 6,590,336 B1 7/2003 Kadota
7,105,880 B2 9/2006 Noguchi et al.
(Continued)

FOREIGN PATENT DOCUMENTS

CN 1665043 A 9/2005
CN 207036312 U 2/2018
(Continued)

OTHER PUBLICATIONS

International Search Report dated Dec. 10, 2019 for corresponding International Patent Application No. PCT/JP2019/037070.
(Continued)

*Primary Examiner* — Bryan P Gordon
(74) *Attorney, Agent, or Firm* — Hauptman Ham, LLP (57) ABSTRACT

For a piezoelectric device, an optical characteristic and/or a piezoelectric characteristic is improved. A piezoelectric device has a first electrode layer, a second electrode layer, and a piezoelectric layer provided between the first electrode layer and the second electrode layer, wherein the piezoelectric layer is formed of a wurtzite crystal material as a main component, to which one or more elements is/are added, said one or more elements being transparent when turned into an oxide, and wherein a haze value is 3% or less, and transmittance with respect to light having a wavelength of 380 nm is 50% or more.

11 Claims, 7 Drawing Sheets

(51) Int. Cl.
*H10N 30/057* (2023.01)
*H10N 30/076* (2023.01)
*H10N 30/079* (2023.01)
*H10N 30/50* (2023.01)
*H10N 30/853* (2023.01)

(52) U.S. Cl.
CPC ......... *H10N 30/079* (2023.02); *H10N 30/708* (2024.05); *H10N 30/853* (2023.02)

(56) References Cited

U.S. PATENT DOCUMENTS

| | | |
|---|---|---|
| 2005/0194626 A1 | 9/2005 | Noguchi et al. |
| 2016/0238466 A1* | 8/2016 | Tanimoto ................. G01L 1/16 |
| 2017/0179923 A1* | 6/2017 | Shin .................. H03H 9/02015 |
| 2018/0069168 A1* | 3/2018 | Ikeuchi ................. H10N 30/40 |
| 2020/0036359 A1* | 1/2020 | Shin ..................... H10N 30/877 |
| 2022/0037580 A1* | 2/2022 | Nakamura ............. C23C 14/08 |

FOREIGN PATENT DOCUMENTS

| | | |
|---|---|---|
| EP | 3 605 627 A1 | 2/2020 |
| JP | 8-310813 A | 11/1996 |
| JP | H10-119164 A | 5/1998 |
| JP | 2004-75511 A | 3/2004 |
| JP | 2005-119166 A | 5/2005 |
| JP | 2005-252069 A | 9/2005 |
| JP | 2011-77124 A | 4/2011 |
| JP | 2017-183414 A | 10/2017 |
| JP | 6273691 B2 | 2/2018 |
| WO | 2015/053089 A1 | 4/2015 |
| WO | 2017/209081 A1 | 12/2017 |

OTHER PUBLICATIONS

Written Opinion dated Dec. 10, 2019 for corresponding International Patent Application No. PCT/JP2019/037070.
Office Action issued on Jul. 19, 2023 for corresponding Korean Patent Application No. 10-2021-7008685, along with an English translation (12 pages).
Extended European Search Report issued on Jun. 23, 2022 for corresponding European Patent Application No. 19866124.1 (10 pages).
Liu et al., "Solidly mounted resonators fabricated for GHz frequency applications based on $Mg_xZn_{1-x}O$ piezoelectric film", Vacuum, vol. 141, Apr. 14, 2017, pp. 254-258 (5 pages).
Chen et al., "Studies on $Mg_xZn_{1-x}O$ Thin Film Resonator for Mass Sensor Application", Frequency Control Symposium and Exposition, 2005, Proceedings of the 2005 IEEE International Vancouver, BC, Canada, Aug. 29-31, 2005, Piscataway, NJ, USA, IEEE, Aug. 29, 2005, pp. 142-145 (4 pages).
Abbassi et al., "First-principles study on the electronic and optical properties of Si and Al co-doped zinc oxide for solar cell devices", Applied Physics A, vol. 122, No. 6, May 10, 2016, pp. 1-7 (7 pages).
Office Action issued on Feb. 7, 2023 for corresponding Japanese Patent Application No. 2019-061630, along with an English translation (6 pages).
Chinese Office Action issued on Nov. 30, 2023, in connection with the Chinese Patent Application No. 201980062331.9, with its English translation, 17 pages.

\* cited by examiner

| | COMPARATIVE EXAMPLE (NON-DOPED) | SAMPLE 1 Mg: 8 atom% | SAMPLE 2 Mg: 15 atom% | SAMPLE 3 Mg: 22 atom% |
|---|---|---|---|---|
| CONFIGURATION | non-doped ZnO : 200 nm / orientation layer SAZO : 10 nm / substrate | Zn-Mg-O (Mg: 8 atom%) : 200 nm / orientation layer SAZO : 10 nm / substrate | Zn-Mg-O (Mg: 15 atom%) : 200 nm / orientation layer SAZO : 10 nm / substrate | Zn-Mg-O (Mg: 22 atom%) : 200 nm / orientation layer SAZO : 10 nm / substrate |
| TRANSMITTANCE @380 nm | 28.0% | 63.9% | 75.9% | 77.9% |
| HAZE | 4.6% | 2.0% | 2.2% | 1.2% |
| CRYSTAL ORIENTATION | 1261.2 | 914.3 | 897.0 | 1603.9 |
| PIEZOELECTRIC CHARACTERISTIC | 0.43 | 0.69 | 0.51 | 0.88 |

FIG.3

| | COMPARATIVE EXAMPLE (NON-DOPED) | SAMPLE 4 Si: 2 atom% | SAMPLE 5 Si: 4 atom% | SAMPLE 6 Si: 8 atom% |
|---|---|---|---|---|
| CONFIG-URATION | non-doped ZnO : 200 nm / orientation layer SAZO : 10 nm / substrate | Zn-Si-O (Si: 2 atom%) : 200 nm / orientation layer SAZO : 10 nm / substrate | Zn-Si-O (Si: 4 atom%) : 200 nm / orientation layer SAZO : 10 nm / substrate | Zn-Si-O (Si: 8 atom%) : 200 nm / orientation layer SAZO : 10 nm / substrate |
| TRANSMITTANCE @380 nm | 28.0% | 35.5% | 51.2% | 65.2% |
| HAZE | 4.6% | 1.6% | 0.9% | 0.7% |
| CRYSTAL ORIENTATION | 1261.2 | 684.6 | 2362.0 | 1474.4 |
| PIEZOELECTRIC CHARACTERISTIC | 0.43 | 0.29 | 0.10 | −0.08 |

| | COMPARATIVE EXAMPLE (NON-DOPED) | SAMPLE 7 | SAMPLE 8 |
|---|---|---|---|
| CONFIG-URATION | non-doped ZnO : 200 nm / orientation layer SAZO : 10 nm / substrate | Zn-Mg-O (Mg: 15 atom%) : 200 nm / Zn-Si-O (Si: 4 atom%) : 50 nm / orientation layer SAZO : 10 nm / substrate | Zn-Mg-O (Mg: 15 atom%) : 200 nm / Zn-Si-O (Si: 4 atom%) : 100 nm / orientation layer SAZO : 10 nm / substrate |
| TRANSMITTANCE @380 nm | 28.0% | 72.4% | 55.5% |
| HAZE | 4.6% | 0.8% | 1.2% |
| CRYSTAL ORIENTATION | 1261.2 | 2733.2 | 2204.4 |
| PIEZOELECTRIC CHARACTERISTIC | 0.43 | 0.94 | 0.64 |

PIEZOELECTRIC DEVICE AND METHOD OF MANUFACTURING THE SAME

CROSS REFERENCE TO RELATED APPLICATION

This application is a National Stage of International Application No. PCT/JP2019/037070, filed on Sep. 20, 2019, which designates the United States and was published in Japan, and which is based upon and claims priority to Japanese Patent Application Nos. 1) 2018-185550, filed on Sep. 28, 2018; and 2) 2019-061630, filed on Mar. 27, 2019 in the Japan Patent Office. All of the aforementioned applications are hereby incorporated by reference in their entireties.

TECHNICAL FIELD

The present invention relates to a piezoelectric device and a method of manufacturing the same.

BACKGROUND ART

Piezoelectric devices, which make use of the piezoelectric effect of substances, have conventionally been adopted. The piezoelectric effect is a phenomenon in which microscopic polarization is produced in response to a mechanical stress applied to a substance. Using the piezoelectric effect, various sensors including pressure sensors, acceleration sensors, and acoustic emission (AE) sensors for detecting elastic waves are commercially available.

In recent years, touch panels have been used as input interfaces of electronic devices such as smartphones, and piezoelectric devices are often applied to the touch panels. A touch panel is integrated into the display device of electronic equipment. In this case, it would be necessary to the piezoelectric layer to be highly responsive to pressure in order to accurately detect manipulations by a finger. Applications to biological sensors are also expected to detect biological signals such as pulse rate or respiratory rate. High sensitivity is again required for such applications.

A sintered film of a piezoelectric material is known, where a chemical solution that contains a compound having a wurtzite crystal structure to which an alkaline earth metal, such as magnesium (Mg), calcium (Ca) or the like is added, is applied by a sol-gel process and sintered. (See, for example, Patent Document 1 presented below).

Another conventional technique is to apply a paste of a mixture of MgO and varnish onto an oriented ZnO film formed by a vapor transport method, and to diffuse Mg into the oriented ZnO film by thermal diffusion. (See, for example, Patent Document 2 presented below). In this method, the paste is applied such that the weight ratio of MgO to the oriented ZnO becomes 0.05 to 2.0 wt %.

SUMMARY OF THE INVENTION

Technical Problem to be Solved

When a crystalline piezoelectric material is used, a piezoelectric layer having a certain degree of thickness is needed to improve the crystal orientation. However, the greater the thickness of the piezoelectric layer, the more likely cracking will occur. Cracks cause fogging in the crystal, and optical characteristics such as haze or transmittance may be deteriorated. Cracks also cause leakage current paths, which adversely affect the piezoelectric characteristics. From the general trend to downsize the device dimensions including the thickness, it is preferred to form the piezoelectric layer as thin as possible. However, when the piezoelectric layer is too thin, it is difficult to obtain satisfactory piezoelectric characteristics in the thickness direction.

An objective of the present invention is to provide a piezoelectric device having satisfactory optical and piezoelectric characteristics, and a method of manufacturing the same.

Technical Solution(s)

In the present invention, by adding a predetermined amount of an impurity to the piezoelectric layer, at least an optical characteristic or a piezoelectric characteristic is improved.

In one aspect, a piezoelectric device has a first electrode layer, a second electrode layer, and a piezoelectric layer provided between the first electrode layer and the second electrode layer, wherein the piezoelectric layer is formed of a wurtzite crystal material as a main component, to which one or more elements is/are added, said one or more elements being transparent when turned into an oxide, and wherein a haze value is 3% or less, and transmittance with respect to light having a wavelength of 380 nm is 50% or more.

Advantageous Effect of the Invention

With the above-described configuration, a piezoelectric device having an improved optical and/or piezoelectric characteristic is achieved.

DESCRIPTION OF PREFERRED EMBODIMENTS

First Embodiment

Figure 1:
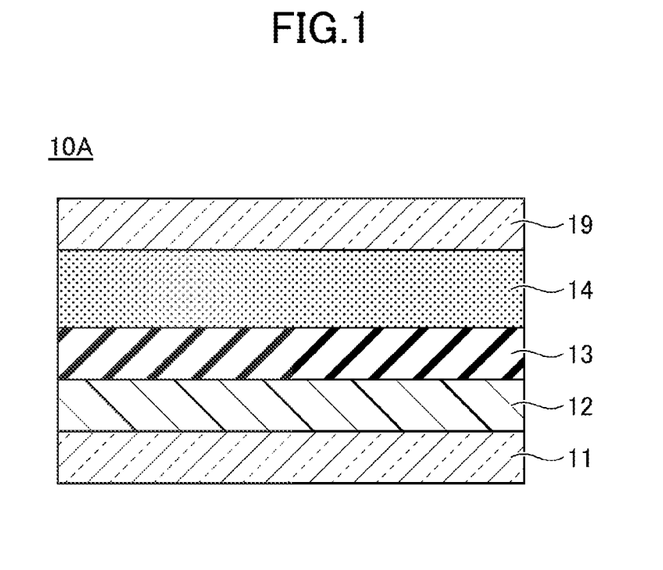
FIG. 1 is a schematic diagram of a piezoelectric device according to the first embodiment.

FIG. 1 is a schematic diagram of a piezoelectric device 10A according to the first embodiment. The piezoelectric device 10A has a stack of layers, including a piezoelectric layer 14, between electrodes 11 and 19. In this example, an orientation control layer 13 and the piezoelectric layer 14 are stacked in this order on a substrate 13 to form the stack of layers provided between the electrodes 11 and 19.

With the configuration of FIG. 1, the electrode 11 may serve as a bottom electrode, and the electrode 19 may serve as a top electrode. The electrodes 11 and 19 may be transparent with respect to a light beam to be used. The need for the electrodes 11 and 19 to be transparent varies depending on applications of the piezoelectric device 10A; however, when the piezoelectric device 10A is applied to a display with a touch panel, light transmission to visible light (wavelength of about 380 nm to 780 nm) is required. Conductive materials transparent to visible light include, but are not limited to, indium tin oxide (ITO), indium zinc oxide (IZO), indium zinc tin oxide (IZTO), indium gallium zinc oxide (IGZO), or the like.

For the substrate 11, any suitable material such as a plastic, a thin glass, or other material may be used. A flexible material that can impart flexibility to the piezoelectric device 10A may be used as the substrate. For example, a plastic layer having a thickness of 1 to 125 μm, more preferably, a plastic layer having a thickness of 20 to 100 μm may be used.

Suitable plastic substrates may include, but are not limited to polyethylene terephthalate (PET), polyethylene naphthalate (PEN), polycarbonate (PC), acrylic resin, cycloolefin polymer, polyimide (PI), and so on. Among these materials, PET, PEN, PC, acrylic resin, and cycloolefin polymer are colorless and transparent materials, and suitably used when light transmission is required for the piezoelectric device 10A. When light transmission is not essential for the piezoelectric device 10A, for example, when the piezoelectric device 10A is applied to health-care products such as pulse rate monitors or heart rate monitors, or pressure-sensor sheets for vehicles, then a semitransparent or opaque plastic material may be used.

Although in FIG. 1, the substrate 12 is provided between the electrode 11 and the orientation control layer 13, the position of the substrate 12 is not limited to that shown in the example. According to the configuration or the fabrication process of the piezoelectric device 10A, the substrate 12 may be provided to an appropriate position.

The piezoelectric layer 14 is formed on the orientation control layer 13. The piezoelectric layer 14 is formed of a piezoelectric material having a wurtzite crystal structure, as a main component, and contains a predetermined amount of impurity as a subcomponent.

A wurtzite crystal structure is represented by general formula AB, where A is a positive cation ($A^{n+}$) and B is a negative anion ($B^{n-}$). It is desirable to select a wurtzite piezoelectric material that exhibits piezoelectric characteristics of a certain level or higher, and that can be crystallized through a low temperature process at or below 200° C. For example, zinc oxide (ZnO), zinc sulfide (ZnS), zinc selenide (ZnSe), zinc telluride (ZnTe), aluminum nitride (AlN), gallium nitride (GaN), cadmium selenide (CdSe), cadmium telluride (CdTe), silicon carbide (SiC), etc. are suitable material having a wurzite crystal structure. The above-described components may be used individually or in combinations of two or more compounds. When two or more of these compounds are combined, layers of the selected compounds may be stacked one by one, or alternatively, a single layer may be formed by simultaneous sputtering using targets of the respective compounds. The selected compound or combination of two or more compounds may be used as the main component forming the wurtzite crystal. Additional components may optionally be added as subcomponents to the wurtzite crystal.

As the subcomponent, it is desirable to select an element that does not cause the piezoelectric layer to exhibit conductivity when the element is added as the subcomponent to the wurtzite crystal, and that contributes to the improvement of at least a piezoelectric characteristic or an optical characteristic. For instance, silicon (Si), magnesium (Mg), calcium (Ca), vanadium (V), titanium (Ti), zirconium (Zr), strontium (Sr), lithium (Li), or a mixture thereof may be used. By adding one or more of these elements, at least the piezoelectric characteristic or the optical characteristic can be improved, as will be described in more detail below.

The thickness of the piezoelectric layer 14 as a whole is 50 nm to 400 nm. When the thickness of the piezoelectric layer 14 exceeds 400 nm, it is difficult to achieve sufficient optical transparency or the haze reducing effect, even when the above-described subcomponent is added. Besides, along with the increase in the thickness of the piezoelectric layer, cracking or crazing is more likely to occur. Cracks cause not only opacity, but also leakage current paths between the electrodes. When the thickness of the piezoelectric layer 14 is less than 50 nm, it is difficult to achieve sufficient piezoelectric characteristics (including pressure-sensitive polarization property) even when the orientation control layer 13 is provided under the piezoelectric layer 14.

The orientation control layer 13 provided under the piezoelectric layer 14 is an amorphous layer, and the thickness is 3 nm to 100 nm. In general, it is considered better to provide a crystalline film as an underlying layer in order to grow a wurtzite crystal, because the wurtzite crystal can grow along the crystal axis of the underlying layer. In contrast, in the embodiment, an amorphous orientation control layer 13 is provided under the piezoelectric layer 14 having a wurtzite crystal structure. The surface of the amorphous orientation control layer 13 is smooth, which can prevent crystal grain boundaries that may cause cracks or leakage current paths from remaining at the interface between orientation control layer 13 and the piezoelectric layer 14. The piezoelectric layer 14 can grow under less influence of lattice strain or stress.

The orientation control layer 13 can be formed of an inorganic substance, an organic substance, or a mixture of an inorganic substance and an organic substance. As the inorganic substance, silicon oxide ($SiO_x$), silicon nitride (SiN), aluminum nitride (AlN), aluminum oxide ($Al_2O_3$), gallium nitride (GaN), gallium oxide ($Ga_2O_3$), and so on can be used. Alternatively, ZnO with $Al_2O_3$ and $SiO_x$ added (which is referred to as "SAZO" representing aluminum/silicon-added zinc oxide), or GaN, AlN, ZnO or other base material to which at least one of $Al_2O_3$, $Ga_2O_3$, $SiO_x$ and SiN is added can be used.

Examples of the organic substance include, but is not limited to an acrylic resin, a urethane resin, a melamine resin, an alkyd resin, and a siloxane-based polymer. In particular, a thermosetting resin composed of a mixture of a melamine resin, an alkyd resin and an organic silane condensate can be preferably used as the organic substance. Using the above-described materials, an amorphous film can be formed by vacuum deposition, sputtering, ion plating, coating, or other appropriate methods. The orientation control layer 17 may be a single layer, or a multilayer with two or more films stacked. In the case of multilayer configuration, an inorganic thin film and an organic thin film may be laminated.

The amorphous orientation control layer 13 formed from the above-described materials is superior in surface smoothness, and the c-axis of the upper layer wurtzite crystal aligns in the direction vertical to the substrate (i.e., along the layer stacking direction). Further, the gas barrier performance is high, and adverse influence of the gas derived from a plastic during the film formation process, which may arise when a plastic substrate is used, can be reduced. In particular, when a thermosetting resin is used to form the orientation control layer 13, highly smooth amorphous layer is acquired. When a melamine resin is used for the orientation control layer 17, the film density is high owing to the three-dimensional crosslinked structure and the barrier performance is good. The orientation control layer 13 is not necessarily 100% amorphous, and it may contain a non-amorphous portion as long as the c-axis orientation can be enhanced. The proportion of the amorphous part in the orientation control layer 13 is preferably 90% or more, more preferably, 95% or more, and further preferably, 100%.

The piezoelectric device 10A can be fabricated by the following process. The electrode 11 is formed on the back surface of the substrate 12. For the electrode 11, an ITO film may be formed by direct current (DC) or radio frequency (RF) magnetron sputtering. Depending on the application of the device, the ITO film may be formed as a solid electrode covering the entire surface, or it may be patterned into a predetermined shape by etching or the like. When the piezoelectric device 10A is applied to a pressure sensor such as a touch panel, the electrode 11 may have a stripe pattern extending in the first direction.

Then, an amorphous orientation control layer 13 is formed on the top surface of the substrate 12, opposite to the electrode 11, by sputtering at room temperature up to the thickness of, for example, 3 to 100 nm. When the thickness is less than 3 nm, it will be difficult to sufficiently improve the orientation of the subsequently formed piezoelectric layer 14. When the thickness of the orientation control layer 13 exceeds 100 nm, it is again difficult to improve the crystallinity of the upper piezoelectric layer 14. The film formation temperature of the orientation control layer 13 is not limited to room temperature. As long as the amorphous state is maintained, the orientation control layer 13 may be formed at a substrate temperature of 150° C. or lower.

Then, a piezoelectric layer 14 is formed on the orientation control layer 13. In one example, a target containing zinc (Zn), oxygen (O) and a predetermined amount of impurity element is used to form the piezoelectric layer 14 by RF magnetron sputtering in a mixed gas atmosphere of argon (Ar) and a tiny amount of oxygen ($O_2$). When Mg is used as the impurity or dopant element, an MgZnO target in which a predetermined ratio of Mg is contained may be used. Alternatively, a ZnO target and a MgO target may be used for simultaneous and independent sputtering in a multi-element sputtering system to perform film formation at a desired doping ratio of Mg.

When a plurality of elements are added as the subcomponents, the piezoelectric layer 14 may include a first piezoelectric film to which a first element is added, and a second piezoelectric film formed on the first piezoelectric film and containing a second dopant element.

The film formation temperature of the piezoelectric layer 14 containing one or more subcomponents may be a temperature other than room temperature, as long as the amorphous state of the lower orientation control layer 13 is maintained. For example, the piezoelectric layer 14 containing subcomponent(s) may be formed at a substrate temperature of 150° C. or lower.

By using the sputtering method to form the orientation control layer 13 and the piezoelectric layer 14, uniform layers with sufficient adhesion can be formed, while maintaining the composition ratio of the target. In addition, a film with a desired thickness can be formed precisely simply by controlling the sputtering time.

Then, an electrode 19 having a predetermined shape is formed on the piezoelectric layer 14. The electrode 19 may be, for example, an ITO film with a thickness of 20 to 100 nm formed by DC or RF magnetron sputtering at room temperature. The electrode 19 may be formed over the entire surface of the stacked layers, or alternatively, it may be patterned into stripes extending in the direction orthogonal to the lower electrode 11 when the lower electrode 11 is patterned into parallel stripes. Thus, the piezoelectric device 10A is fabricated.

After the electrode 19 is formed, the entirety of the piezoelectric device 10A may be heat-treated at, for example, 130° C., which is below the melting point or the glass transition point of the substrate 12. By this post-heating, the ITO electrode can be crystallized and the resistance can be reduced. The heat treatment after fabrication of the device is not essential, and may be omitted. Depending on the material of the substrate 12, the substrate 12 may not have heat resistance. In this case, it is preferable not to perform post-heating.

Figure 2:
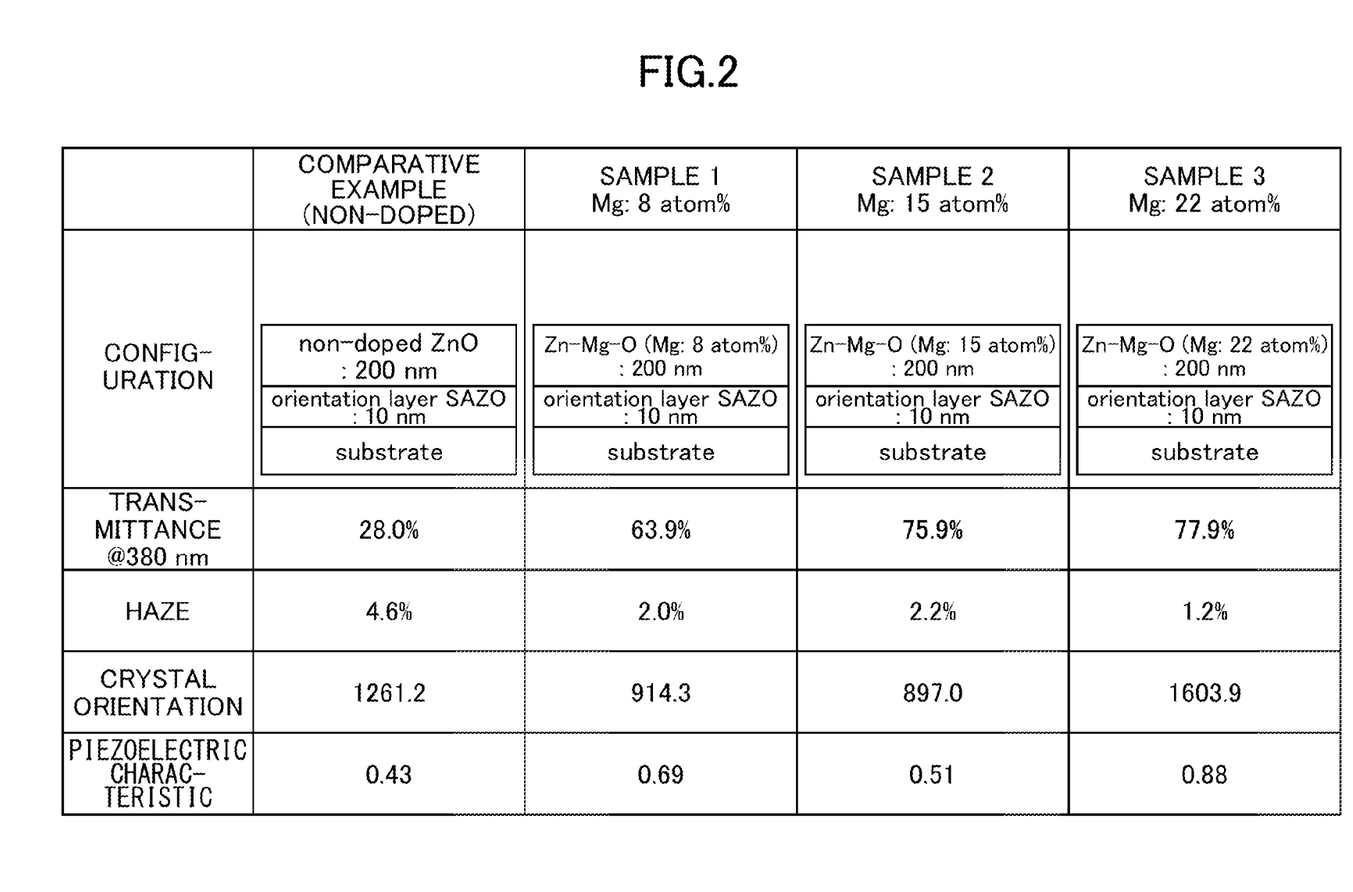
FIG. 2 shows the evaluation result of the piezoelectric devices having the configuration of FIG. 1.
Figure 3:
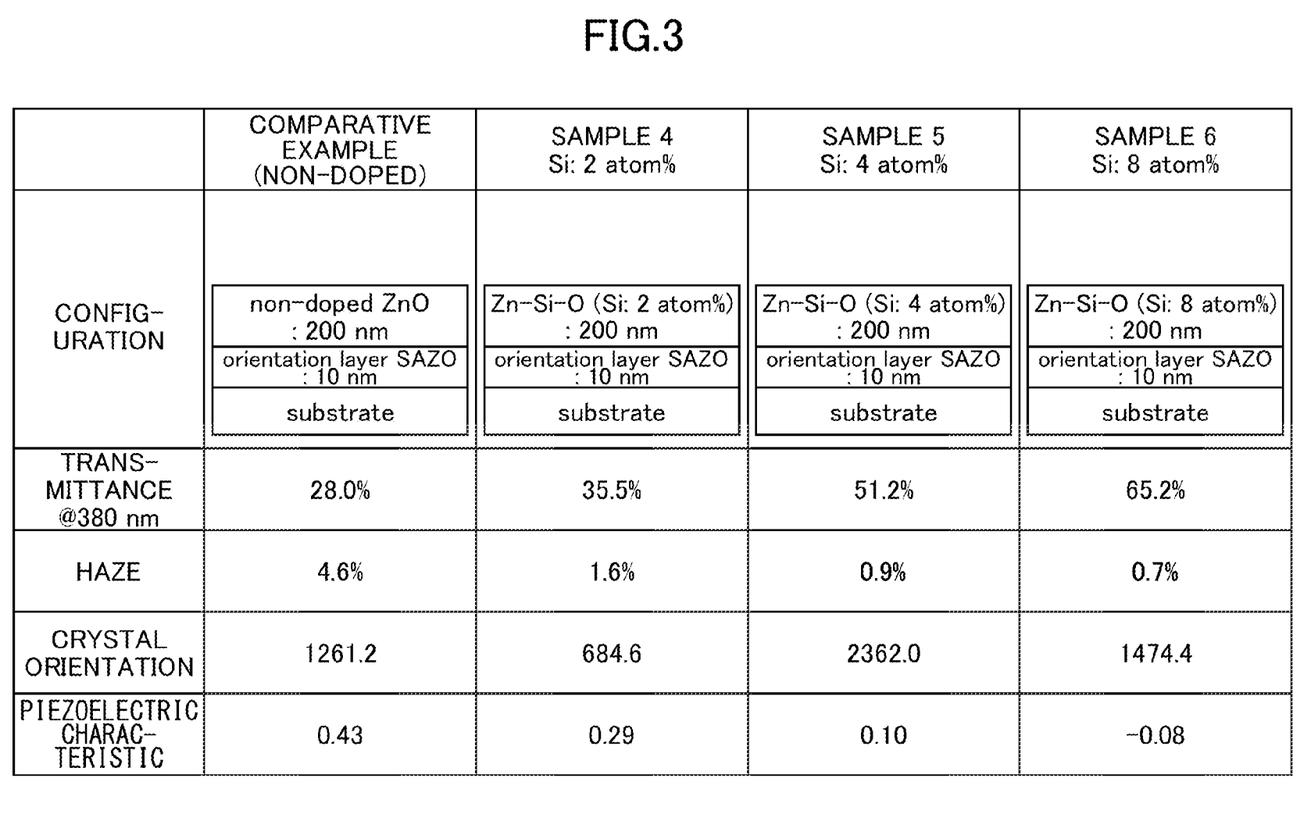
FIG. 3 shows the evaluation result of the piezoelectric devices having the configuration of FIG. 1.

FIG. 2 and FIG. 3 show evaluation results of the piezoelectric device having the configuration of FIG. 1. In FIG. 2, samples are prepared by forming SAZO having a thickness of 10 nm as the orientation control layer 13 on a transparent plastic substrate 12 by sputtering, and then forming a piezoelectric layer 14 having a thickness of 200 nm on the orientation control layer 13. The main component of the piezoelectric layer 14 is ZnO, and Mg is added as the subcomponents. Multiple samples with different amounts of Mg dopant are prepared. As a comparative example, a non-doped sample without Mg dopant is also prepared.

In FIG. 3, samples are prepared in the similar manner to FIG. 2, but Si is added as the subcomponent, in place of Mg. The rest of the conditions of the sample fabrication are the same as those in FIG. 2. Namely, a SAZO film having a thickness of 10 nm is formed as the orientation control layer 13 on a transparent plastic substrate 12 by sputtering, and a piezoelectric layer 14 having a thickness of 200 nm is formed on the orientation control layer 13. The main component of the piezoelectric layer 14 is ZnO, and multiple samples with different amounts of Si dopant are prepared.

In forming the piezoelectric layer 14 of FIG. 3, a ZnO target and a $SiO_2$ target may be used. In this case, the sputtering conditions for the respective targets may be individually controlled to simultaneously perform sputtering using the two targets so as to add a desired amount of Si. As an alternative, a metallic silicon target may be used.

The parameters evaluated are transmittance, haze, crystal orientation of the piezoelectric layer 14, and piezoelectric characteristic. The optical transmittance is acquired by measuring the intensity of light at wavelength of 380 nm incident from the back face of the substrate 12 and transmitted through each sample. The transmittance is represented as a ratio of the intensity of the transmitted light to the intensity of the incident light.

Haze (or crystal opacity) indicates the degree of opacity of a crystal, and is represented as the percentage of the scattered component of the light passing through the material to the total transmitted light. Haze is affected by crystallinity and surface roughness. The smaller the haze value, the higher the transparency. A haze meter manufactured by Suga Test Instruments Co., Ltd. is used to measure the haze.

The crystal orientation is determined from the X-ray rocking curve (XRC) method, observing the reflection from the (0002) plane of the piezoelectric layer 14 and measuring the full width at half maximum (FWHM) of the X-ray locking curve of each sample. The evaluation value of crystal orientation is calculated by dividing the peak area (i.e., the integral of peak intensity) by FWHM. The reflection locking curve from the (0002) plane of the piezoelectric layer 14 indicates how parallel the crystal axes in the c-axis direction. The greater the peak intensity of the X-ray locking curve, and the smaller the FWHM, the better the c-axis orientation of the main component ZnO. Accordingly, the greater the evaluation value calculated by dividing the peak integral by FWHM, the better the crystal orientation.

The piezoelectric characteristic is evaluated by the d33 value. The value of d33 indicates the expansion/contraction mode in the thickness direction, and is represented by the amount of polarization charge per unit pressure [C/N] applied in the thickness direction. The d33 parameter is often called "piezoelectric coefficient". The higher the d33 value, the better the polarization in the thickness (or c-axis) direction. The d33 value is directly measured using a piezometer PM300 manufactured by Piezotest Limited.

The top and bottom faces of each sample are held by the electrodes of the piezometer, and an indenter is pressed against the surface of the piezoelectric layer 14 to apply a low-frequency load onto the sample. The amount of charge generated is measured by a coulomb meter. The value calculated dividing the measured charge amount by the load is output as the d33 value. The greater the absolute value of d33, the better the piezoelectric characteristic in the film thickness direction.

Comparative Example

FIG. 2 and FIG. 3 also show the evaluation result of a comparative example that uses a non-doped ZnO as the piezoelectric layer 14. In the comparative example, the transmittance with respect to light of 380-nanometer wavelength is as low as 28.0%. This is because of the energy bandgap of ZnO, and light with a longer wavelength (for example, 400 nm or longer) is transmitted. When this comparative configuration is applied to a display device, the image quality (or the color) may deteriorate in the region from blue-purple to purple of visible light, near the ultraviolet region.

The haze value of the comparative example is 4.6%, which may be somewhat transparent, but is still insufficiently transparent.

The value representing the crystal orientation is 1261.2, which is relatively high. This is because the amorphous orientation control layer 13 is provided under the piezoelectric layer 14, and because the c-axis orientation of the piezoelectric layer 14 is improved.

The piezoelectric characteristic (namely, the d33 value) is 0.43 [C/N], which is relatively high, and a certain level of polarization is acquired in the thickness direction.

(Sample 1)

In Sample 1 of FIG. 2, the amount of Mg with respect to the total amount of Zn and Mg in the piezoelectric layer 14 is 8 atom %.

The transmittance with respect to light having a wavelength of 380 nm is 63.9%, which is a significant improvement over the comparative example. This is because the energy bandgap of MgO is greater than that of ZnO, and light of 380 nm wavelength is transmitted through without being absorbed.

The haze value is 2.0%, which is also a significant improvement over the comparative example. The value indicating the crystal orientation is 914.3, which is slightly less than that of the comparative example, but is within the acceptable range. The piezoelectric property (d33) is 0.69 [C/N], which is again a significant improvement over the comparative example.

(Sample 2)

In Sample 2, the amount of Mg with respect to the total amount of Zn and Mg in the piezoelectric layer 14 is 15 atom %.

The transmittance with respect to 380-nanometer wavelength light is 75.9%, which is a significant improvement over the comparative example. The transmittance is higher than that of Sample 1 because the proportion of MgO that has a wide energy bandgap is increased.

The haze value is 2.2%, which is also a significant improvement over the comparative example. The value indicating the crystal orientation is 897.0, which is slightly less than that of the comparative example, but is still in the acceptable range. The piezoelectric property (d33) is 0.51 [C/N], which is again a significant improvement over the comparative example.

(Sample 3)

In Sample 3, the amount of Mg with respect to the total amount of Zn and Mg in the piezoelectric layer 14 is 22 atom %. The transmittance with respect to 380-nanometer wavelength light is 77.9%, which is further improved as compared with Sample 1 and Sample 2. The haze value is very good, as low as 1.2%. The scattering is small, and the transparency is high.

The value indicating the crystal orientation is as great as 1603.9, which means that a sharp locking curve is obtained. The piezoelectric characteristic (d33) is 0.88 [C/N], which is about double the comparative example, and the piezoelectric characteristic in the film thickness direction is greatly improved.

From the evaluation result of FIG. 2, it can be understood that the amount of Mg with respect to the total of Zn and Mg is 5 atom % to 30 atom %, preferably 7.0 atom % to 25.0 atom %, and more preferably 8.0 atom % to 22. By selecting the Mg ratio from the above-described range, both the optical characteristics and the piezoelectric characteristics are improved.

(Sample 4)

In evaluation of FIG. 3, Si is added as the subcomponent to the piezoelectric layer 14. In sample 4, the amount of Si with respect to the total amount of Zn and Si of the piezoelectric layer 14 is 2 atom %.

The transmittance with respect to light having a wavelength of 380 nm is 35.5%, which is slightly better than the comparative example. This is because the energy bandgap of SiO$_2$ is greater than that of ZnO, and because the proportion of the transmitted light of 380 nm wavelength is increased.

The haze value is 1.6%, which is a a significant improvement over the comparative example. However, the value indicating the crystal orientation is 684.6, which is about half the value of the comparative example. The piezoelectric characteristic value (d33) in the film thickness direction also decreases to 0.29 [C/N].

(Sample 5)

In sample 5, the amount of Si with respect to the total amount of Zn and Si of the piezoelectric layer 14 is 4 atom %. The transmittance with respect to light having a wavelength of 380 nm is 51.2%, which is better than the comparative example. The haze value is as small as 0.9% and scattering is very small.

The value indicating the crystal orientation is 2362.0, which is a significant improvement over the comparative example. The piezoelectric characteristic value (d33) in the film thickness direction is as small as 0.10 [C/N].

(Sample 6)

In sample 6, the amount of Si with respext to the total amount of Zn and Si of the piezoelectric layer 14 is 8 atom %. The transmittance with respect to light having a wavelength of 380 nm is 65.2%, which is a significant improvement over the comparative example. The haze value is as small as 0.7%, and the optical characteristics are further improved from Sample 5.

The value indicating the crystal orientation is 1474.4, which is a significant improvement over the comparative example. The piezoelectric characteristic value (d33) in the film thickness direction is as small as 0.08 [C/N]. In addition, the polarization is reversed.

From the evaluation result shown in FIG. 3, it can be understood that the amount of Si with respect to the total amount of Zn and Si is 3 atom % to 10 atom %, preferably 3.5 atom % to 9.0 atom %, and more preferably 4.0 atom % to 8.0 atom %. By setting the adding amount of Si to the above-described range, the crystal orientation and the optical characteristics are greatly improved.

From the above-described results, it is also understood that in the configuration of FIG. 1, the optical characteristics of the piezoelectric layer 14 formed of a wurtzite crystal material are improved by adding a predetermined amount of Mg or Si to the wurtzite crystal. Among the optical characteristics, the transmittance can be controlled to a desired level by adjusting the energy bandgap of the wurtzite such as ZnO by adding a subcomponent.

Regarding the haze, when the substrate 12 is formed of a plastic, the haze value may be affected by the surface unevenness of the substrate 12. However, the same plastic substrate 12 is used in Sample 1 through Sample 6, and there is no difference in the substrate material among the samples. Further, by providing the amorphous orientation control layer 13 on the substrate 12, the influence of the surface unevenness of the plastic substrate is absorbed. Therefore, it is considered that the variation in the haze value among the samples is mainly due to the crystallinity inside the piezoelectric layer 14 and the surface roughness. It is inferred that adding Mg or Si to ZnO improves the c-axis orientation or surface flatness of the piezoelectric layer 14, thereby reducing scattering and the haze value.

Regarding the piezoelectric characteristic, the Mg dopant greatly improves the d33 parameter. Meanwhile, by adding a predetermined amount of Si, crystal orientation and optical characteristics are greatly improved.

When Mg is added to the main component ZnO of the piezoelectric layer 14, the amount of Mg with respect to the total amount of Zn and Mg is 5 atom % to 30 atom %, preferably 7.0 atom % to 25.0 atom %, and more preferably 8.0 atom % to 22.0 atom %.

When Si is added to the main component ZnO of the piezoelectric layer 14 as ZnO, the amount of Si with respect to the total amount of Zn and Si is 3 atom % to 10 atom %, preferably 3.5 atom % to 9.0 atom %, and more preferably 4.0 atom % to 8.0 atom %.

By adding a predetermined amount of impurity as the subcomponent selected from a group consisting of Mg, Si, Ca, V, Ti, Zr, Sr, Li or a mixture thereof to the main component of the wurtzite crystal, satisfactory optical characteristics can be achieved such that the transmittance to 380 nm wavelength light is 50% or more, while the haze is 3.0% or less.

Second Embodiment

Figure 4:
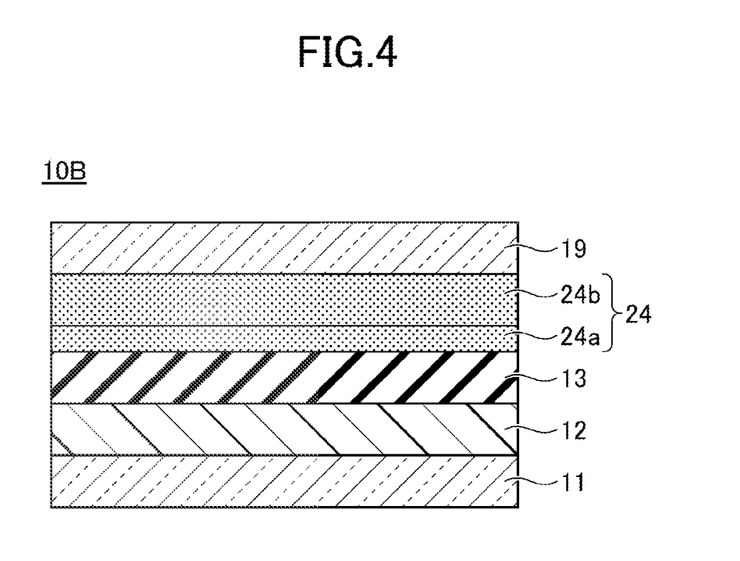
FIG. 4 is a schematic view of a piezoelectric device according to the second embodiment.

FIG. 4 is a schematic diagram of a piezoelectric device 10B, which is a second modification of the device shown in FIG. 4. In the piezoelectric device 10B, a piezoelectric layer 24 is formed of multiple layers to which different subcomponents are added. Otherwise, the configuration is the same as that of the piezoelectric device 10A of FIG. 1.

The piezoelectric device 10B has a stack of layers in which a substrate 12, an orientation control layer 13, and a piezoelectric layer 24 stacked in this order between electrodes 11 and 19. By providing the orientation control layer 13 on the substrate 12 and forming the piezoelectric layer 24 on the orientation control layer 13, the c-axis orientation of the piezoelectric layer 24 is improved.

The piezoelectric layer 24 includes a first piezoelectric film 24a to which a first subcomponent is added and a second piezoelectric film 24b to which a second subcomponent is added. The main components of the first piezoelectric film 24a and the second piezoelectric film 24b may be the same or different from each other, but both have a wurtzite crystal structure. From the viewpoint of lattice constant matching, the same material may be used as the main components.

The subcomponents added to the first piezoelectric film 24a and the second piezoelectric film 24b are elements that do not cause the piezoelectric films to exhibit conductivity when added to the main components and that contribute to the improvement of at least a piezoelectric characteristic or an optical characteristic. For example, silicon (Si), magnesium (Mg), calcium (Ca), vanadium (V), titanium (Ti), zirconium (Zr), strontium (Sr), lithium (Li) or a mixture thereof may be used. As will be described below, by adding a subcomponent selected from these elements, the piezoelectric characteristics can be maintained and/or the optical characteristics can be improved.

Figure 5:
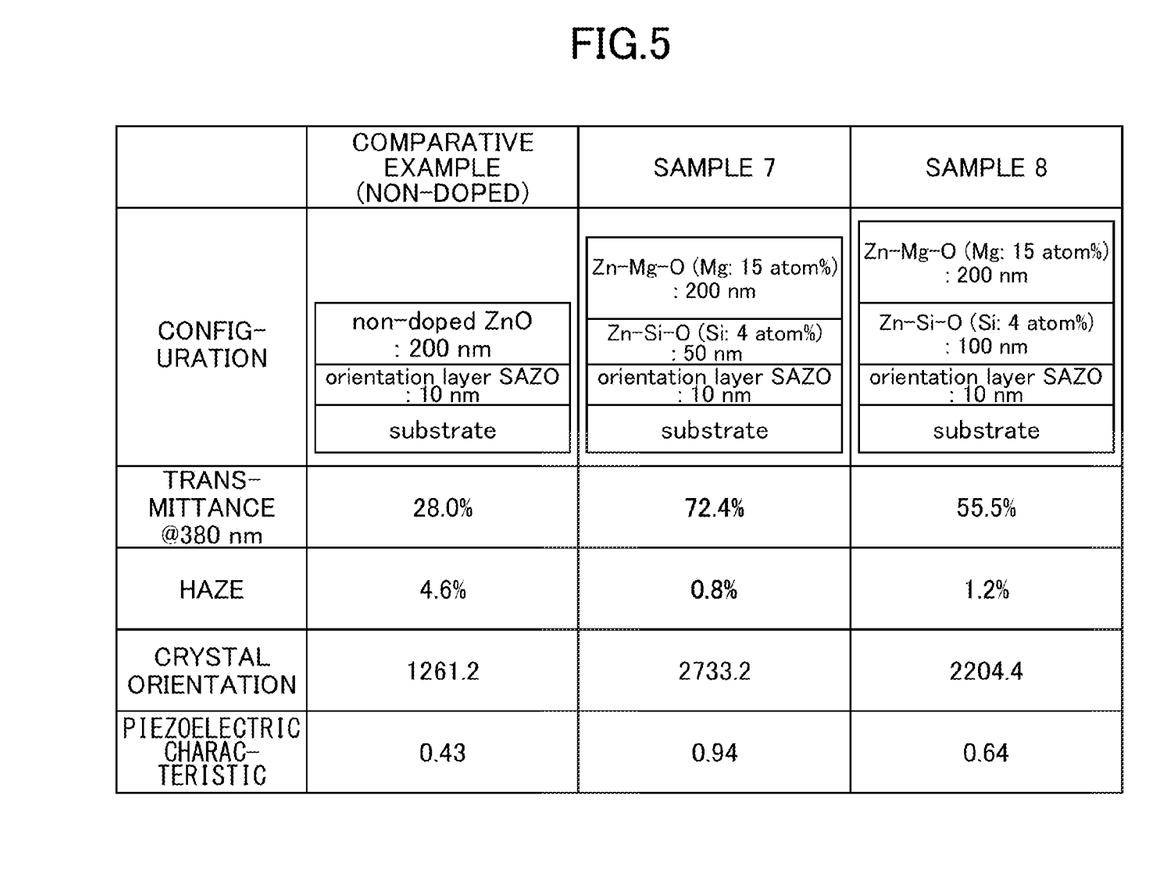
FIG. 5 shows the evaluation result of the piezoelectric devices having the configuration of FIG. 4.

FIG. 5 shows the evaluation results of the piezoelectric device having the configuration of FIG. 4. The piezoelectric layer 24 is composed of two piezoelectric films to which different kinds of subcomponents are added. A plurality of samples are prepared by changing the thickness of the first piezoelectric film. The other configurations are the same as those of Sample 1 to Sample 6 of the first embodiment. The comparative example has the same configuration as that used in the first embodiment, using the non-doped ZnO piezoelectric layer. The evaluation parameters are transmittance, haze, crystal orientation, and piezoelectric characteristic, as in the first embodiment.

(Sample 7)

In Sample 7 of FIG. 5, a first piezoelectric film 24a having a thickness of 50 nm and a second piezoelectric film 24b having a thickness of 200 nm are stacked in this order on the SAZO orientation control layer 13 having a thickness of 10 nm. The main components of the first piezoelectric film 24a and the second piezoelectric film 24b are both ZnO. Si is added to the first piezoelectric film 24a as a subcomponent, and Mg is added to the second piezoelectric film 24b as a subcomponent. The amount of Si with respect to the total amount of Zn and Si in the first piezoelectric film 24a is 4 atom %. The amount of Mg with respect to the total amount of Zn and Mg in the second piezoelectric film 24b is 15 atom %.

The transmittance of Sample 7 with respect to light having a wavelength of 380 nm is 72.4%, and the haze value is 0.8%, both of which are significant improvement over the comparative example. Regarding the transmittance, it is inferred that the optical characteristics of the second piezoelectric film 24b to which Mg is added are dominant. Meanwhile, it is inferred that the haze value is improved by adding Si as a subcomponent. The value indicating the crystal orientation is 2733.2, which is more than double the comparative example and greatly improved. The absolute value of the piezoelectric characteristic (d33) is as great as 0.94 [C/N], and the piezoelectric characteristic in the film thickness direction is greatly improved.

(Sample 8)

Sample 8 is prepared using the same subcomponents as in Sample 7 having the same compositions and materials, except that the thickness of the first piezoelectric film is changed to 100 nm. On the SAZO orientation control layer 13 having a thickness of 10 nm, a first piezoelectric film 24a of 100 nm thickness in which Si is added to ZnO and a second piezoelectric film 24b of 200 nm thickness in which Mg is added to ZnO are formed in this order.

The amount of Si with respect to the total amount of Zn and Si in the first piezoelectric film 24a is 4 atom %, and the amount of Mg to the total amount of Zn and Mg in the second piezoelectric film 24b is 15 atom %.

The transmittance of Sample 8 with respect to 380 nm wavelength light is 55.5%, and the haze value is 1.2%. Both are improvement over the comparative example. In Sample 8, the thickness of the first piezoelectric film 24a with Si dopant added is doubled from Sample 7. Accordingly, the transmittance to 380 nm wavelength light is slightly lower than that of Sample 7, but it is still sufficient and within the acceptable range. The value indicating the crystal orientation is 2204.4, which is almost twice as improved as that of the comparative example. The absolute value of the piezoelectric characteristic (d33) is 0.64 [C/N], and the piezoelectric characteristic in the film thickness direction is improved compared with the comparative example.

From the results of FIG. 5, it is understood that when Si is added to the first piezoelectric film, the amount of Si with respect to the total amount of Zn and Si is 3 atom % to 10 atom %, preferably 3.5 to 9.0 atom %, and more preferably 4.0 atom % to 8.0 atom %.

When Mg is added to the second piezoelectric film, the amount of Mg with respect to the total amount of Zn and Mg is 5 atom % to 30 atom %, preferably 7.0 atom % to 25.0 atom %, and more preferably 8.0 atom % to 22.0 atom %.

It is inferred that the Zn—Si—O film used as the first piezoelectric film 24a of the piezoelectric layer 24 in Samples 7 and 8 serves as a buffer layer. Referring back to the evaluation results of FIG. 2 and FIG. 3, it is already understood that the crystal orientation of the Zn—Si—O piezoelectric layer of Sample 5 and Sample 6 is very good, but the piezoelectric characteristic in the thickness direction is insufficient, and that the d33 value of the Zn—Mg—O piezoelectric layer of Sample 1 to Sample 3 is very good.

Based on these findings, the second piezoelectric film 24b formed of Zn—Mg—O is provided to impart the original function of a piezoelectric material, and the first piezoelectric film 24a formed of Zn—Si—O serves as a buffer layer that improves the crystal orientation of the second piezoelectric film 24b. By adding 3 atom % to 10 atom % Si dopant to the first piezoelectric film 24a, the crystal orientation of Zn—Si—O becomes very good, and consequently, the crystal orientation of the second piezoelectric film 24b growing on the first piezoelectric film 24a is also improved.

In this configuration, the thickness of the first piezoelectric film 24a is preferably about 1/10 to 1/2 of the thickness of the second piezoelectric layer 24b so as not to be too thick. With this two-layer structure, the crystallinity and the thickness mode piezoelectric characteristic of the piezoelectric layer 24 as a whole are significantly improved, and a device having excellent piezoelectric performance can be obtained. Because the optical characteristics of the first piezoelectric film 24a and the second piezoelectric film 24b are both good, the optical characteristics of the piezoelectric layer 24 as a whole are also good.

Modifications

Figure 6:
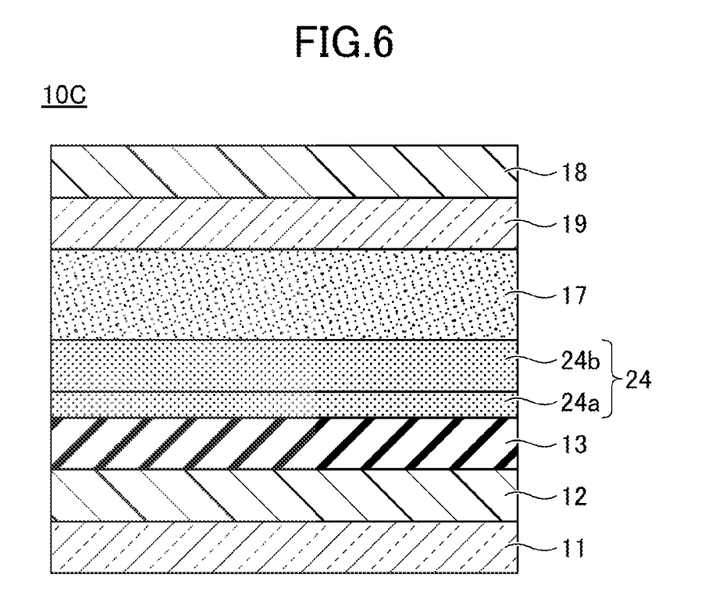
FIG. 6 is a schematic diagram of a first modification of the piezoelectric device of FIG. 4.

FIG. 6 is a schematic diagram of a piezoelectric device 10C, which is a first modification of the piezoelectric device of FIG. 4. The piezoelectric device 10C has an adhesive layer 17 between the piezoelectric layer 24 and the second electrode 19. The piezoelectric layer 24 includes a first piezoelectric film 24a and a second piezoelectric film 24b, similarly to the piezoelectric device 10B of FIG. 4. In each of the first piezoelectric film 24a and the second piezoelectric film 24b, a subcomponent is added at a prescribed ratio to the main component having a wurtzite crystal structure. As the subcomponent, Mg, Si, Ca, V, Ti, Zr, Sr, Li or a mixture thereof may be used and is added at a predetermined ratio.

When ZnO is the main component and Mg is added as the subcomponent thereto, the amount of Mg with respect to the total amount of Zn and Mg is 5 atom % to 30 atom %, preferably 7.0 atom % to 25.0 atom %, and more preferably 8.0 atom % to 22.0 atom %. When ZnO is the main component and Si is added as the subcomponent thereto, the amount of Si with respect to the total amount of Zn and Si is 3 atom % to 10 atom %, preferably 3.5 atom % to 9.0 atom %, and more preferably 4.0 atom % to 8.0 atom %. By doping Mg and/or Si at a ratio in the above-described range, at least an optical characteristic or a piezoelectric characteristic can be improved, compared with the undoped zinc compound.

When the adhesive layer 17 is formed of a conductive material, the combination of the adhesive layer 17 and the electrode 19 may function as a top electrode.

The piezoelectric device 10C can be fabricated by the following process. In a first part of the device, an electrode 11 is formed on one surface of the substrate 12, and a stack of layers of an orientation control layer 13, a first piezoelectric film 24a, and a second piezoelectric film 24b provided in this order is formed on the other surface of the substrate 12. Subcomponents are added to the first piezoelectric film 24a and the second piezoelectric film 24b, respectively, at predetermined ratios. Meanwhile, in a second part of the device, the electrode 19 is formed on another substrate 18. Any type of substrate can be used as the substrate 18, and a plastic substrate may be used, for example. The first part and the second part are held such that the piezoelectric layer 24 of the first part and the electrode 19 of the second part face each other, and are bonded together with the adhesive layer 17 to complete the laminated structure of the piezoelectric device 10C.

With this configuration, the optical characteristics and piezoelectric characteristic of the piezoelectric layer 24 are improved, and the resulting piezoelectric device is suitable for applications that require transparency to visible light, such as displays. In such applications, it is desirable that the adhesive layer 17, the electrode 19, and the substrate 18 are transparent to visible light.

Figure 7:
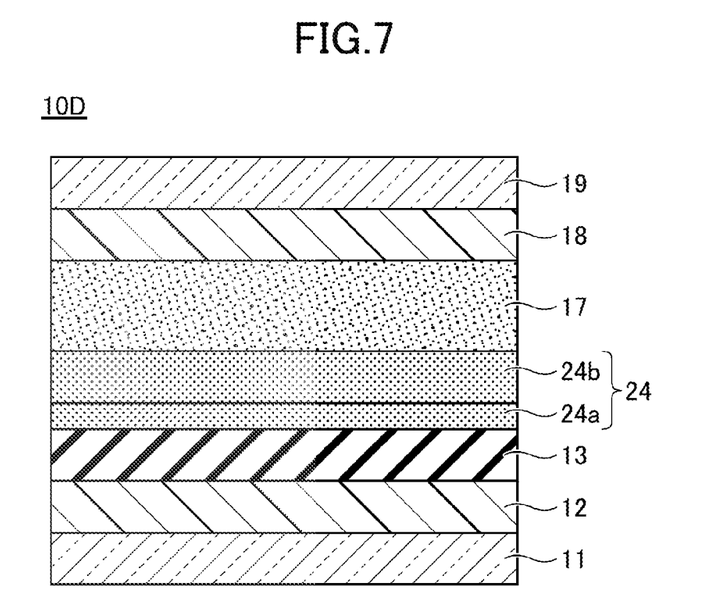
FIG. 7 is a schematic diagram of a second modification of the piezoelectric device of FIG. 4.

FIG. 7 is a schematic diagram of a piezoelectric device 10D, which is a second modification of the piezoelectric device of FIG. 4. The piezoelectric device 10D has a configuration in which the positions of the electrodes 19 and the substrate 18 of FIG. 6 are reversed, and the adhesive layer 17 is provided between the piezoelectric layer 24 and the substrate 18. The other configurations are the same as those of the piezoelectric device 10C of FIG. 6.

The piezoelectric device 10D is fabricated by the following process. In a first part of the device, an electrode 11 is formed on one surface of the substrate 12, and a stack of layers of an orientation control layer 13, a first piezoelectric film 24a, and a second piezoelectric film 24b provided in this order is formed on the other surface of the substrate 12, opposite to the electrode 11. Subcomponents are added to the first piezoelectric film 24a and the second piezoelectric film 24b respectively at predetermined ratios. In a second part of the device, an electrode is formed on one surface of another substrate 18. The first part and the second part are held such that substrate 18 of the second part and the piezoelectric layer 24 of the first part face each other, and bonded together by the adhesive layer 17.

This configuration can also improve the optical characteristics and the piezoelectric characteristic of the piezoelectric layer 24, and the resulting piezoelectric device is suitable in applications for which transparency to visible light is required, such as in displays.

Figure 8:
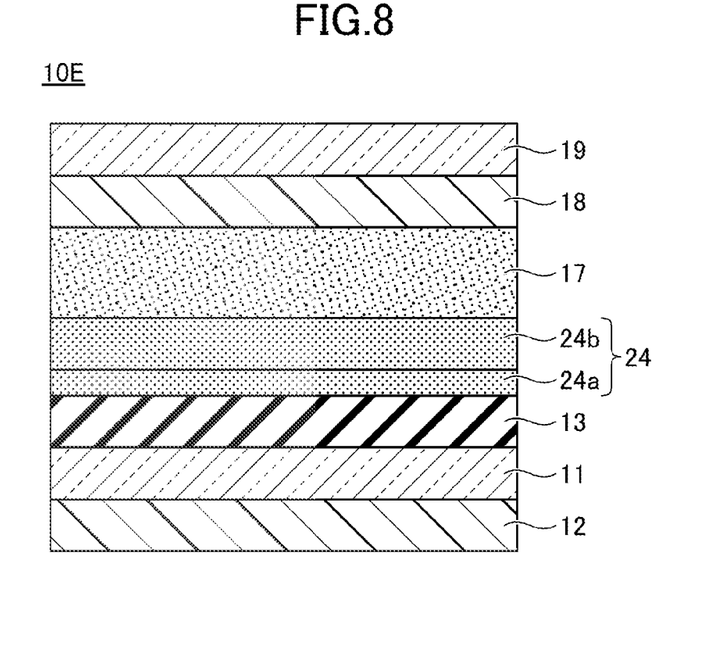
FIG. 8 is a schematic diagram of a third modification of the piezoelectric device of FIG. 4.

FIG. 8 is a schematic diagram of a piezoelectric device 10E, which is a third modification of the piezoelectric device of FIG. 4. The piezoelectric device 10E has a configuration in which the positions of the electrodes 11 and the substrate 12 of FIG. 7 are reversed. The other configurations are the same as those of the piezoelectric device 10D of FIG. 7.

The piezoelectric device 10E is fabricated by the following process. In a first part of the device, an electrode 11 is formed on a surface of the substrate 12, and then an orientation control layer 13, a first piezoelectric film 24a, and a second piezoelectric film 24b are formed in this order on the electrode 11. For the electrode 11, a transparent amorphous oxide conductive film such as an ITO film or an IZO film may be formed. Subcomponents are added to the first piezoelectric film 24a and the second piezoelectric film 24b respectively at predetermined ratios. In a second part of the device, an electrode 19 is formed on one surface of another substrate 18. The first part and the second part are held such that the other surface of the substrate 18, opposite to the electrode 19, faces the piezoelectric layer 24 of the first part, and are bonded together by the adhesive layer 17.

This configuration can also improve the optical characteristics and the piezoelectric characteristic of the piezoelectric layer 24, and the resulting piezoelectric device is suitable in applications for which transparency to visible light is required, such as in displays.

Figure 9:
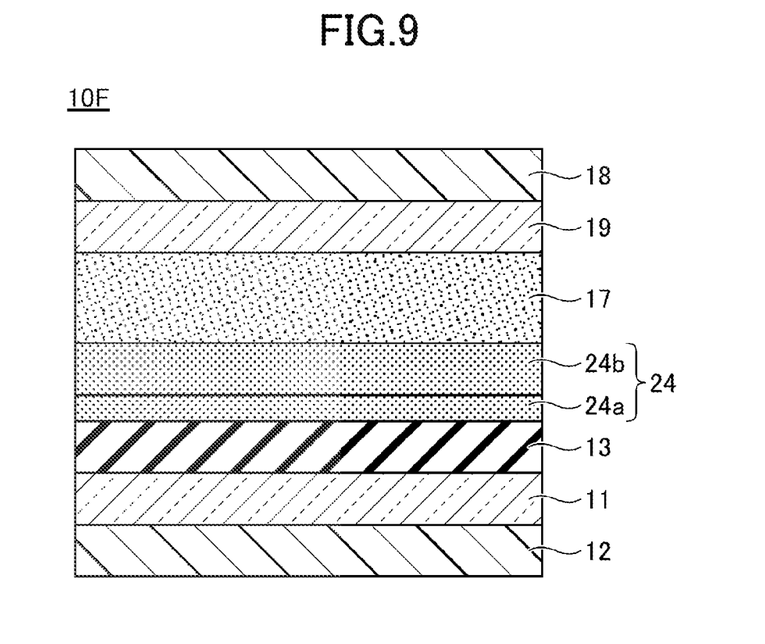
FIG. 9 is a schematic diagram of a fourth modification of the piezoelectric device of FIG. 4.

FIG. 9 is a schematic diagram of a piezoelectric device 10F, which is a fourth modification of the piezoelectric device of FIG. 4. The piezoelectric device 10F has a configuration in which the positions of the electrodes 11 and the substrate 12 of FIG. 1 are reversed. The other configurations are the same as those of the piezoelectric device 10D of FIG. 7.

The piezoelectric device 10F is fabricated by the following process. In a first part of the device, an electrode 11 is formed on a surface of the substrate 12, and then an orientation control layer 13, a first piezoelectric film 24a, and a second piezoelectric film 24b are formed in this order on the electrode 11. For the electrode 11, a transparent amorphous oxide conductive film such as an ITO film or an IZO film may be formed. Subcomponents are added to the first piezoelectric film 24a and the second piezoelectric film 24b respectively at predetermined ratios. In a second part of the device, an electrode 19 is formed on one surface of another substrate 18. The first part and the second part are held such that the electrode 19 of the second part faces the piezoelectric layer 24 of the first part, and bonded together by the adhesive layer 17.

This configuration can also improve the optical characteristics and the piezoelectric characteristic of the piezoelectric layer 24, and the piezoelectric device is suitable to display applications that require transparency to visible light.

Although specific examples of the present invention have been described above, the present invention is not limited to the particulars of the above-described examples. For example, in the modifications of FIG. 6 to FIG. 9, a single-layer piezoelectric layer 14 illustrated in FIG. 1 may be used in place of the piezoelectric layer 24 with the two-layer structure. A predetermined amount of a subcomponent selected from a group consisting of Mg, Si, Ca, Ti, V, Zr, Sr, Li, or a mixture thereof may be added to the piezoelectric layer 14. When a subcomponent other than Mg and Si is selected, simultaneous sputtering may be performed using a ZnO target and a metal or metal oxide target of the selected element.

The piezoelectric layer 24 may be formed of three or more piezoelectric films. In this case, the main components of the piezoelectric films may be the same or different. From the viewpoint of lattice constant matching, the same material may be used as the main component of the piezoelectric layer. The subcomponents added to the respective piezoelectric films may be the same or different.

In such alterations, the addition of a predetermined amount of a subcomponent selected from a group consisting of Mg, Si, Ca, Ti, Zr, Sr, V, Li, or a mixture thereof to the wurtzite crystal as the main component, improves at least an optical characteristic or a piezoelectric characteristic of the piezoelectric device.

LISTING OF SYMBOLS 10A to 10F: piezoelectric device
11: electrode (first electrode layer)
19: electrode (second electrode layer)
13: orientation control layer
14, 24: piezoelectric layer
24a: first piezoelectric film
24b: second piezoelectric film

PRIOR ART DOCUMENT(S)

Patent Document 1: Japan Patent No. 6273691
Patent Document 2: Japanese Patent Application Laid-open Publication No. H8-310813

What is claimed is:
1. A piezoelectric device comprising:
a first electrode layer;
a second electrode layer; and
a piezoelectric layer provided between the first electrode layer and the second electrode layer,
wherein the piezoelectric layer comprises a first piezoelectric film over a first surface of a substrate and a second piezoelectric film over the first piezoelectric film, the first piezoelectric film and the second piezoelectric film have a wurtzite crystal structure and have ZnO as a main component, to which one or more elements is/are added,
wherein a haze value is 3% or less, and transmittance with respect to light having a wavelength of 380 nm is 50% or more, and
wherein Si is added to the first piezoelectric film.
2. The piezoelectric device as claimed in claim 1, wherein the piezoelectric layer further comprises an element selected from a group consisting of Mg, Ca, Ti, Zr, Sr, V, Li, or a mixture thereof, as a subcomponent added to the main component.

3. The piezoelectric device as claimed in claim 1, wherein said one or more elements is Mg, and an amount of Mg with respect to a total amount of Zn and Mg is 5 atom % to 30 atom %.

4. The piezoelectric device as claimed in claim 1, wherein said one or more elements is Si, and an amount of Si with respect to a total amount of Zn and Si is 3 atom % to 10 atom %.

5. The piezoelectric device as claimed in claim 1,
wherein the Si is present in the first piezoelectric film in an amount of 3 atom % to 10 atom % with respect to a total of Zn and Si, and
wherein Mg is present in the second piezoelectric film in an amount of 5 atom % to 30 atom % with respect to a total of Zn and Mg.

6. The piezoelectric device as claimed in claim 5, wherein a thickness of the first piezoelectric film is 20 nm to 100 nm.

7. The piezoelectric device as claimed in claim 5, wherein a thickness of the first piezoelectric film is 1/10 to 1/2 of a thickness of the second piezoelectric film.

8. The piezoelectric device as claimed in claim 1, further comprising:
an amorphous orientation control layer provided under the piezoelectric layer.

9. The piezoelectric device as claimed in claim 1, wherein the piezoelectric device is formed on a plastic substrate or a thin glass.

10. A method of manufacturing a piezoelectric device; the method comprising:
forming a first piezoelectric film by sputtering onto a surface of a first electrode, the first piezoelectric film including a wurtzite crystal material as a main component, and a first subcomponent added to the main component;
forming a second piezoelectric film by sputtering onto the first piezoelectric film in a stacking direction to fabricate a piezoelectric layer that includes the first piezoelectric film and the second piezoelectric film, the second piezoelectric film including the wurtzite crystal material as the main component, and a second subcomponent; and
providing a second electrode on the piezoelectric layer,
wherein the main component is ZnO, the first subcomponent is Si, and the second subcomponent is Mg, and
wherein an amount of Si with respect to a total amount of Zn and Si in the first piezoelectric film is 3 atom % to 10 atom %, and an amount of Mg with respect to a total amount of Zn and Mg in the second piezoelectric film is 5 atom % to 30 atom %.

11. The method as claimed in claim 10, further comprising:
forming an amorphous orientation control layer as an underlying layer of the piezoelectric layer.

* * * * *